(12) United States Patent
Otsuki et al.

(10) Patent No.: US 6,261,370 B1
(45) Date of Patent: Jul. 17, 2001

(54) PRODUCT HOLDER

(75) Inventors: Masashi Otsuki, Musashimurayama; Shigeki Endo, Tokorozawa, both of (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/570,723

(22) Filed: May 15, 2000

(30) Foreign Application Priority Data

May 21, 1999 (JP) ................................. 11-142360

(51) Int. Cl.[7] ................................. B05C 13/00
(52) U.S. Cl. ............ 118/500; 204/298.15; 269/21; 269/287; 269/900
(58) Field of Search ............ 204/298.15; 264/287, 264/21, 900; 118/500

(56) References Cited

U.S. PATENT DOCUMENTS

| | | | | |
|---|---|---|---|---|
| 4,439,261 | * | 3/1984 | Pavone et al. | 156/345 |
| 5,788,447 | * | 8/1998 | Yonemitsu et al. | 414/217 |
| 6,001,180 | * | 12/1999 | Inoue | 118/500 |

FOREIGN PATENT DOCUMENTS

| | | | |
|---|---|---|---|
| 61-6110 | 1/1986 | (JP) | C01B/31/36 |
| 5-24818 | 2/1993 | (JP) | C01B/31/36 |
| 10-67565 | 3/1998 | (JP) | C04B/35/626 |

OTHER PUBLICATIONS

Hendricks, C.J., Cathode Plate For Backside Oxide Strip In An RIE Reactor, IBM Tech. Disc. Bul., vol. 23, No. 12, May 1981.*

Shaefer, H.G., "Silicon Anode Plate", IBM Tech. Disc. Bul., vol. 17, No. 10, Mar. 1975.*

* cited by examiner

*Primary Examiner*—Nam Nguyen
*Assistant Examiner*—Steven H. VerSteeg
(74) *Attorney, Agent, or Firm*—Oliff & Berridge, PLC (57) ABSTRACT

A product holder that does not cause a product to become cracked or contaminated at the time of being conveyed and transported, subjected to a sputtering treatment, or the like, can be detected by an infrared ray detector, is superior in its strength, durability, chemical resistance, and the like, and is easily handled is disclosed. This product holder for holding a product having opposite end surfaces and is composed of a silicon carbide sintered body having a product accommodating portion, which accommodates and holds the product such that one end surface of the product is exposed, wherein a groove portion is formed in the product accommodating portion at a position which abuts the other end surface of the product, which opposes the one end surface.

18 Claims, 8 Drawing Sheets

PRODUCT HOLDER

BACKGROUND OF THE INVENTION

1. Field of the Invention

The present invention relates to a product holder which accommodates and holds a product such as an electronic device component, a semiconductor wafer or the like in order to convey and transport the product or to carry out a sputtering treatment or the like.

2. Description of the Related Art

A semiconductor manufacturing device, a semiconductor surface treating device, or the like is designed for semiconductors having diameters of 6 inches, 8 inches, and 12 inches. Accordingly, when semiconductors having diameters other than the abovementioned diameters are to be processed by the semiconductor surface treating device or the like, a special product holder is needed. The product holder is used to fix in advance the product such as the electronic device component, the semiconductor wafer or the like in the case of conveying and transporting the product or carrying out a sputtering treatment or the like for the product, from the viewpoint of preventing the product from being contaminated or damaged. A holder formed by silicon or quartz has been conventionally used.

Figure 8:
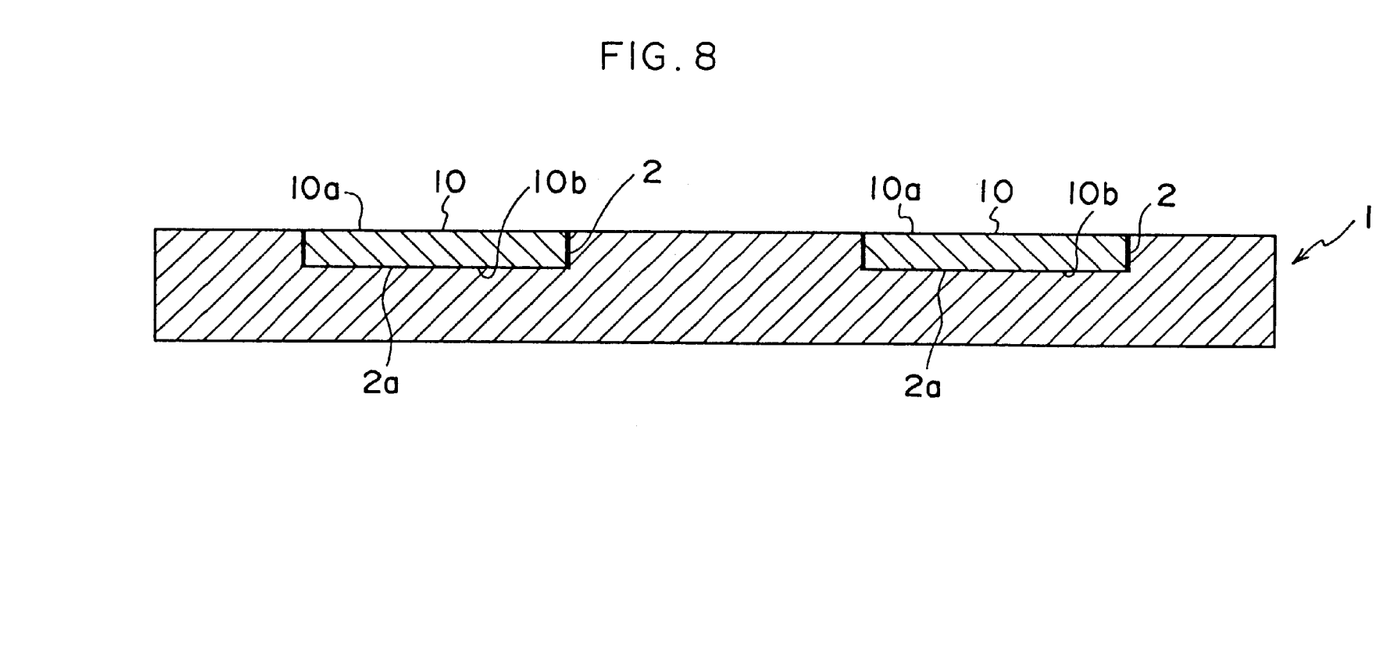
FIG. 8 is a schematic cross-sectional explanatory view for explaining a state in which a semiconductor wafer is accommodated and held in a conventional product holder.

However, a product holder formed by silicon or quartz does not have sufficient strength. There arises a problem that the product holder formed by silicon or quartz is often cracked at the time of conveyance and transportation thereof or at the time of the sputtering treatment or the like. When the product holder formed by silicon or quartz is used, a portion of the product which abuts the product holder is apt to be contaminated by the product holder. Namely, as shown in FIG. 8, an other end surface 10b of a product 10, which other end surface 10b contacts a bottom surface 2a of a product accommodating portion 2 of a product holder 1 and opposes an exposed one end surface 10a of the product 10, is apt to be contaminated by the product holder 1. Therefore, cleaning the product holder by acids in advance to eliminate contamination of the product holder has been considered. However, in the above case, there arises a problem that the product is melted by the acids. Further, there arises a problem that a product holder formed by transparent quartz cannot be detected by an infrared ray sensor.

SUMMARY OF THE INVENTION

The present invention is provided in order to solve the abovedescribed problems with conventional product holders, and to accomplish the following object. The object of the present invention is to provide a product holder that does not cause a product to become contaminated or damaged at the time of conveyance and transportation thereof or at the time of a sputtering treatment or the like, can be detected by an infrared ray sensor, is vastly superior in its strength, durability, chemical resistance, and the like, and is easily handled.

A first aspect of the product holder of the present invention is a product holder for holding a product having opposite end surfaces comprising a silicon carbide sintered body having a product accommodating portion which accommodates and holds the product such that one end surface thereof is exposed, wherein a groove portion is formed in the product accommodating portion at a position which abuts the other end surface of the product, which opposes the one end surface thereof.

The product holder of the first aspect of the present invention is formed by the silicon carbide sintered body, and therefore has high strength. When the product is accommodated and held in the product accommodating portion, the product holder itself and the product accommodating portion do not become cracked. Even if it is necessary to carry out cleaning with acids or the like, the product holder is not melted by the acids. Further, the product holder is superior in its durability. The product holder has the product accommodating portion which accommodates and holds the product such that the one end surface thereof is exposed. The groove portion is formed in the product accommodating portion at a position which abuts the other end surface of the product, which opposes the one end surface thereof. Accordingly, since the contact area between the product accommodated and held in the product accommodating portion and the product accommodating portion is small, the product is not contaminated thereby.

According to a second aspect of the product holder of the present invention, an area of the other end surface of the product which abuts against the product accommodating portion is no more than 50% of the total area of the other end surface.

In the product holder of the second aspect of the present invention, the area of the other end surface of the product which abuts the product accommodating portion is 50% or less of the total area of the other end surface. Accordingly, since the contact area between the product and the product accommodating portion is small, the product is not contaminated due to contact with the product accommodating portion.

According to a third aspect of the product holder of the present invention, the product is a disc-shaped semiconductor wafer.

In the product holder of the third aspect of the present invention, the product is the disc-shaped semiconductor wafer. Therefore, the semiconductor wafer is securely accommodated and held in the product holder when the semiconductor wafer is conveyed and transported or is subjected to the sputtering treatment or the like. The semiconductor wafer is neither contaminated nor damaged thereby.

According to a fourth aspect of the product holder of the present invention, the silicon carbide sintered body is formed by sintering a mixture of silicon carbide powder and a non-metallic sintering aid and has a density of at least 2.9 g/cm$^3$.

In the product holder of the fourth aspect of the present invention, the silicon carbide sintered body is formed by sintering the mixture of the silicon carbide powder and the non-metallic sintering aid and has a density of 2.9 g/cm$^3$ or more. Therefore, the product holder is superior in its strength, chemical resistance, durability, and the like.

According to a fifth aspect of the product holder of the present invention, the groove portion includes end portions, which abut the other end surface of the product when a product is held by the holder, the end portions being formed in a curved surface.

In the product holder of the fifth aspect of the present invention, the end portions of the groove portion, which abut against the other end surface of the product, are formed with a curved surface. Therefore, the product is not scratched by the end portions and damage and the like is not caused to the product at the time of conveyance and transportation thereof.

According to a sixth aspect of the product holder of the present invention, the groove portion includes a bottom surface and a through hole is formed through the bottom surface of the groove portion.

In accordance with the product holder of the sixth aspect of the present invention, the through hole is formed at the bottom surface of the groove portion. Accordingly, when gas or liquid such as water enters into the product accommodating portion from the through hole, the product can be easily removed from the product accommodating portion.

According to a seventh aspect of the product holder of the present invention, the product includes an outer circumferential side surface and an outer circumferential groove portion is formed, thereby exposing a circumferential side surface of the product when the product is accommodated in the product accommodating portion.

In accordance with the product holder of the seventh aspect of the present invention, the outer circumferential groove portion is formed, by which is exposed the circumferential side surface of the product accommodated and held in the product accommodating portion. Therefore, if a suitable bar member is made to abut against the exposed circumferential side surface of the product and is drawn up, the product can be easily removed from the product accommodating portion.

According to an eighth aspect of the product holder of the present invention, the product includes a peripheral side surface and a through hole is formed, by which a portion of the circumferential side surface of the product accommodated in the product accommodating portion is exposed, into which a bar member is inserted for removing the product, and by which a portion of the other end surface of the product is exposed.

In the product holder of the eighth aspect of the present invention, the through hole is formed, by which a portion of the circumferential side surface of the product accommodated in the product accommodating portion is exposed, into which the bar member is inserted for removing the product, and by which a portion of the other end surface of the product is exposed. If the bar member is inserted into the through hole, engaged with the other end surface of the product and drawn up while being engaged therewith, the product can be easily removed from the product accommodating portion.

According to a ninth aspect of the product holder of the present invention, at least two product accommodating portions are provided.

In the product holder of the ninth aspect of the present invention, the product holder has the two or more than two product accommodating portions. Accordingly, the product is efficiently conveyed and transported. Further, the sputtering treatment or the like is efficiently carried out with respect to the product.

According to a tenth aspect of the product holder of the present invention, the product holder is conductive.

In the product holder of the tenth aspect of the present invention, the product holder is conductive and therefore, discharges static electricity to effectively inhibit adhesion of dust due to static electricity.

DESCRIPTION OF THE PREFERRED EMBODIMENTS

A product holder of the present invention is formed by a silicon carbide sintered body and has a product accommodating portion and other portions which are appropriately selected if necessary.

Silicon Carbide Sintered Body

Shape, structure, size and the like of the silicon carbide sintered body are not especially limited, but for convenient conveyance, transportation, and treatment of the product, a disc shape is preferable. The structure of the silicon carbide sintered body may be a single structure or may be a structure which consists of two or more members. The size of the silicon carbide sintered body need only be such that it can accommodate and hold the product therein and may be appropriately selected in accordance with purposes.

The silicon carbide sintered body may be manufactured appropriately by a known method or may be a commercially available product. For example, preferable examples of the silicon carbide sintered body include a silicon carbide sintered body which is formed by sintering a mixture of silicon carbide powder and a non-metallic sintering aid and machining the resulting sintered body to a desired shape by a known method of electric discharging machining or the like.

A density of the silicon carbide sintered body is preferably 2.9 g/cm$^3$ or more, and is more preferably 3.0 to 3.2 g/cm$^3$. When the density is less than 2.9 g/cm$^3$, the strength of the product holder is not sufficient and the durability thereof may deteriorate.

A volume resistivity of the silicon carbide sintered body is usually about $1 \times 10^{-1}$ to $1 \times 10^{-2}$ Ω·cm. The silicon carbide sintered body reflects infrared rays and therefore, the product holder of the present invention can be detected by an infrared ray sensor. It is preferable that the silicon carbide sintered body has excellent conductivity from the viewpoint of discharging static electricity and effectively inhibiting adhesion of dust or the like.

Product Accommodating Portion

A product accommodating portion has a function of accommodating and holding the product in a state in which one end surface of the product is exposed. Shape, structure, size and the like of the product accommodating portion are not especially limited as long as the product accommodating portion has the above-described function, and may be appropriately selected in accordance with shape, structure, size, and the like of the product. For example, if the product is a semiconductor wafer, a disc-shaped product accommodating portion having the same inner diameter as the outer diameter of the semiconductor wafer and the same depth as the thickness of the semiconductor wafer, or the like may be used.

A groove portion is formed in the product accommodating portion at a position abutting the other end surface of the product, which opposes the one end surface thereof. Shape, structure, size and the like of the groove portion are not especially limited and may be appropriately selected in accordance with purposes. For example, a groove portion having a circular configuration, a rectangular configuration, or the like, when seen from above, may be used.

The number of the product accommodating portions is not especially limited and may be appropriately selected in accordance with purposes. One product accommodating portion may be used, or two or more product accommodating portions may be used. Using two or more product accommodating is advantageous because the product can be efficiently conveyed and transported, and the sputtering treatment and the like can be efficiently carried out.

In the present invention, the groove portion is preferably designed such that a contact area between the product and the product accommodating portion is as small as possible, in view of preventing contamination of the product which is accommodated and held in the product accommodating portion. Specifically, the contact area between the product accommodating portion and the other end surface of the product, which opposes the one end surface thereof exposed from the product holder, is preferably small. The contact area is preferably 50% or less of the total area of the other end surface of the product. If the contact area is large, contamination may be caused due to the contact of the product and the product accommodating portion or the like.

It is preferable to design the groove portion such that an outer periphery of opening portions of the groove portion of the product accommodating portion which contacts the product (i.e., end portions of the groove portion seen in cross-sectional views illustrated in FIGS. 1, 3, 4, 5, and 6) is as short as possible, from the viewpoint of preventing the product accommodated and held in the product accommodating portion from being scratched. Specifically, among groove portions which have same outer diameters of the opening portions thereof, a groove portion having a small outer periphery, i.e., a groove portion whose outer periphery is a circular configuration, is preferable. For example, when the diameter of a circular groove portion is the same length as one side of a square groove portion, the circular groove portion is preferable because an outer periphery of an opening portion of the circular form is shorter than that of an opening portion of the square form. When the outer periphery of the opening portions of the groove portion is long, the product may be contaminated by contacting with the product accommodating portion.

In the present invention, from the viewpoint of preventing the product from being scratched and damaged while being conveyed and transported, it is preferable to form the end portions of the groove portion, which abut against the other end surface of the product, with a curved surface (R machining).

A through hole is preferably formed at a bottom surface of the groove portion. In the case in which the through hole is formed, if gas or liquid is made to flow from outside to the bottom surface of the groove portion, the gas or liquid is loaded within the product accommodating portion. When gas or liquid is entered and loaded into the product accommodating portion while the product is accommodated and held in the product accommodating portion, the product can be easily removed from the product accommodating portion by the pressure of the gas or liquid.

In the present invention, an outer circumferential groove portion, from which the circumferential side surface of the product accommodated in the product accommodating portion is exposed, is preferably formed in a vicinity of an open end portion of the product accommodating portion. In this case, the product can be easily removed from the product accommodating portion by making a suitable bar member or the like abut against the exposed circumferential side surface of the product and drawing the bar member up.

Further, in the present invention, it is preferable to form a through hole at the product accommodating portion, by which a portion of the circumferential side surface and a portion of the other end surface of the product accommodated in the product accommodating portion is exposed. A bar member can be inserted into the through hole to remove the product from the product accommodating portion. In this case, the product can be easily removed from the product accommodating portion by inserting the bar member into the through hole, making the bar member engage with the other end surface of the product and drawing the bar member up in the engaged position.

The product used for the product holder of the present invention is not especially limited and may be appropriately selected in accordance with purposes. Examples of the product to be used include an electronic device component, a semiconductor wafer, and the like.

Although an example of a preferred aspect of the present invention will be described as embodiments hereinafter while making reference to the drawings, the present invention is not limited to these embodiments.

First Embodiment

Figure 1:
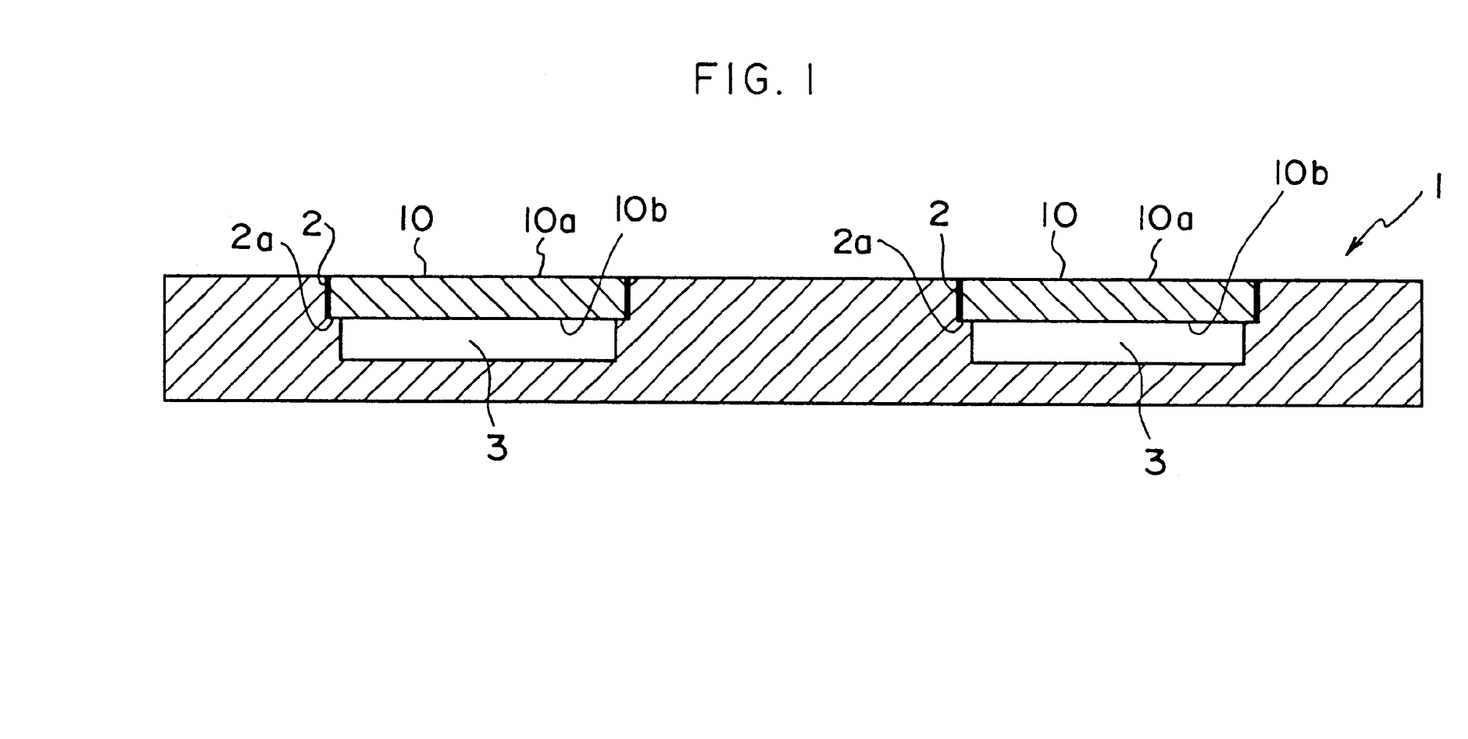
FIG. 1 is a schematic cross-sectional explanatory view for explaining a state in which a semiconductor wafer is accommodated and held in a product holder of a first embodiment.
Figure 2:
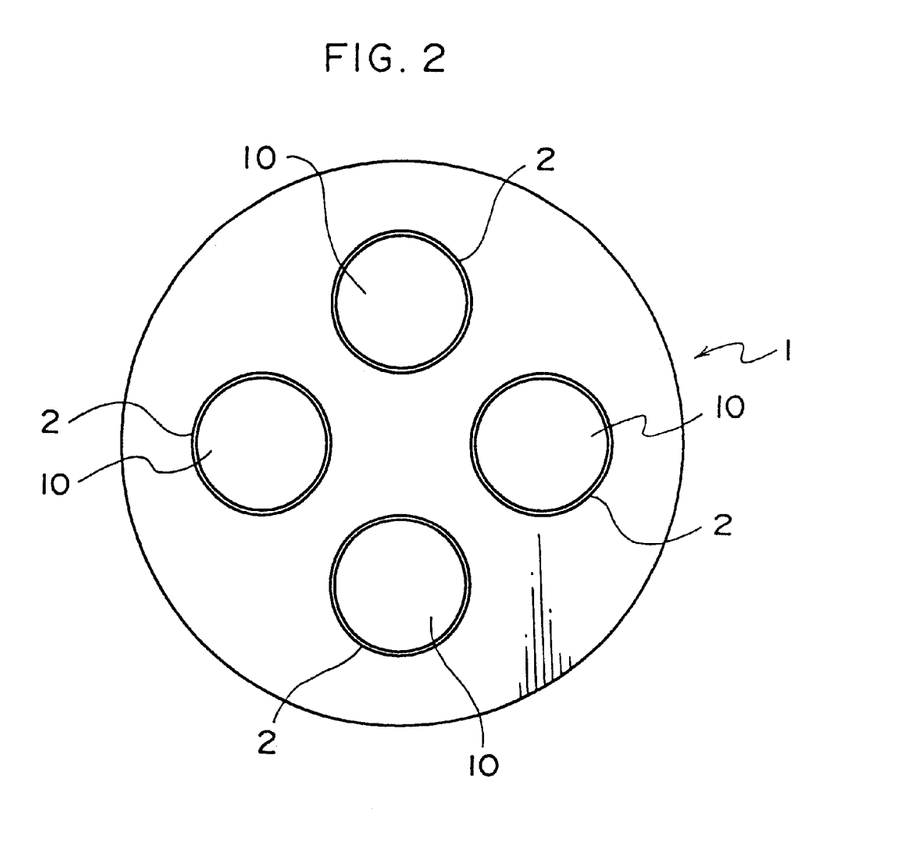
FIG. 2 is a top view of FIG. 1.

FIG. 1 is a schematic cross-sectional explanatory view for explaining a state in which a semiconductor wafer is accommodated and held in a product holder of a first embodiment. FIG. 2 shows a top view of FIG. 1. As illustrated in FIGS. 1 and 2, the product holder 1 of the first embodiment has four product accommodating portions 2, spaced an equal distance from the center of the product holder 1 at mutually symmetrical positions.

The product holder 1 is formed by a silicon carbide sintered body which is formed by sintering a mixture of silicon carbide powder and a non-metallic sintering aid, and has a volume resistivity of $1 \times 10^{-2} \Omega \cdot cm$ and a density of 3.14 g/cm$^3$. Further, the product holder 1 is formed by molding the silicon carbide sintered body into a disc having a diameter of 300 mm and a thickness of 1.2 mm, by electric discharging machining.

A semiconductor wafer 10 which is formed in a disc shape and has a diameter of 4 inches and a thickness of 0.7 mm is accommodated and held in the product accommodating portion 2 of the product holder 1. At this time, the semiconductor wafer 10 is accommodated and held in the product accommodating portion 2 such that one end surface 10a of the semiconductor wafer 10 is exposed. A groove portion 3 is provided in the product accommodating portion 2 at a position abutting the other end surface 10b of the semiconductor wafer 10, which opposes the one end surface 10a thereof.

The groove portion 3 is formed so as to be concentric with a bottom surface 2a of the product accommodating portion 2 and is formed in a disc shape. The diameter of the groove portion 3 is a little smaller than that of the bottom surface 2a of the product accommodating portion 2 such that only a small portion of the bottom surface 2a is exposed.

The semiconductor wafer 10, which is a product, is accommodated and held in the product accommodating portion 2 of the product holder 1 such that the one end surface 10a of the semiconductor wafer 10 is exposed at the surface of the product holder. At this time, the depth of the groove portion 3 is set to be almost the same as the thickness of the semiconductor wafer 10. Accordingly, the exposed one end surface 10a of the semiconductor wafer 10 is positioned at almost the same level as the surface of the product holder 1. The other end surface 10b of the semiconductor wafer 10, which opposes the one end surface 10a, contacts the bottom surface 2a of the product accommodating portion 2. The contact area between the other end surface 10b and the bottom surface 2a is small because the groove portion 3 is provided at the product accommodating portion 2.

Since the outer diameter of the semiconductor wafer 10 is almost the same as the inner diameter of the product accommodating portion 2, when the semiconductor wafer 10 is accommodated in the product accommodating portion 2, the semiconductor wafer 10 does not fall off easily from the product holder 1 and is held stably in the product holder 1. Therefore, when the semiconductor wafer 10 is conveyed and transported while being accommodated and held in the product accommodating portion 2 of the product holder 1, the semiconductor wafer 10 is not damaged. As the contact area between the semiconductor wafer 10 and the product holder 1 is small, contamination due to the contact between the semiconductor wafer 10 and the product holder 1 or the does not occur. As a result, cleaning with acids or the like to remove contamination and the like is not necessary. Even if cleaning is needed, since the product holder 1 is formed by the silicon carbide sintered body, it is not melted by the acids or the like.

The product holder 1 is extremely superior in its strength, chemical resistance, durability, and the like. Further, the product holder 1 is easily handled. A treatment such as a sputtering treatment or the like can be easily carried out on the semiconductor wafer 10 while it is accommodated and held in the product accommodating portion 2 of the product holder 1. As mentioned above, four product accommodating portions 2 are formed in the product holder 1 and therefore, the semiconductor wafer 10 can be efficiently conveyed, transported, and treated.

Second Embodiment

Figure 3:
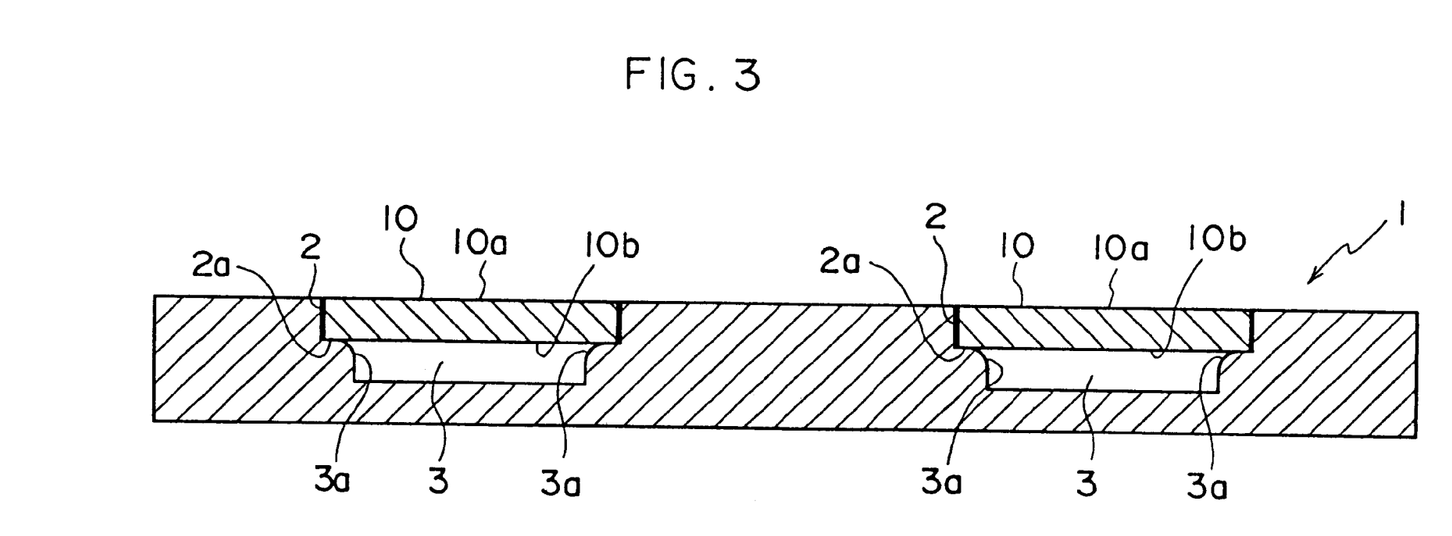
FIG. 3 is a schematic cross-sectional explanatory view for explaining a state in which a semiconductor wafer is accommodated and held in a product holder of a second embodiment.

As shown in FIG. 3, a product holder 1 of a second embodiment has the same structure as that of the product holder 1 of the first embodiment except for the following difference. The product holder 1 of the second embodiment is different from the product holder 1 of the first embodiment in that end portions 3a of the groove portion 3 formed at the product accommodating portion 2, which abut the other end surface 10b of the semiconductor wafer 10, are formed in a curved surface (R machining). On the basis of the difference, in addition to the effects of the product holder 1 of the first embodiment, the product holder 1 of the second embodiment has the following effect.

In the product holder 1 of the second embodiment, the product accommodating portion 2 and the groove portion 3 form a continuous curved surface and the connecting portions therebetween are not formed in a corner shape. Accordingly, unlike the product holder 1 of the first embodiment, the semiconductor wafer 10 accommodated and held in the product accommodating portion 2 does not abut against the corner portions. As a result, formation of scratches caused by the contact between the semiconductor wafer 10 and the corner portion at the time of conveying and transporting the semiconductor wafer 10 is effectively inhibited. Namely, the semiconductor wafer 10 is not scratched.

Third Embodiment

Figure 4:
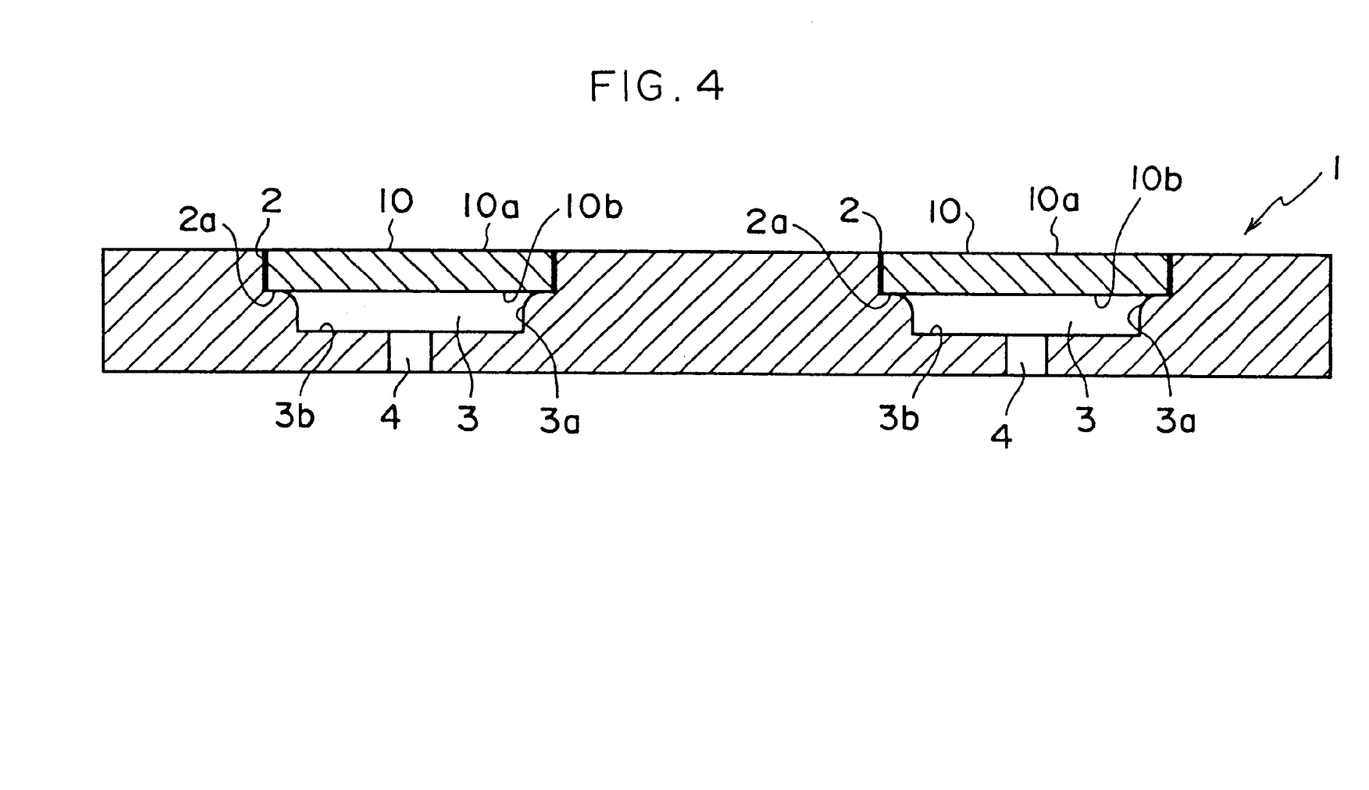
FIG. 4 is a schematic cross-sectional explanatory view for explaining a state in which a semiconductor wafer is accommodated and held in a product holder of a third embodiment.

As shown in FIG. 4, a product holder 1 of a third embodiment has the same structure as that of the product holder 1 of the second embodiment except for the following difference. The product holder of the third embodiment is different from the product holder 1 of the second embodiment in that a through hole 4 is formed in a bottom surface 3b of the groove portion 3 formed in a product accommodating portion 2. On the basis of this difference, in addition to the effects of the product holder 1 of the second embodiment, the product holder 1 of the third embodiment has the following effects.

The through hole 4 extends from the bottom surface 3b of the groove portion 3 in the product accommodating portion 2 of the product holder 1 to the end portion at which the product accommodating portion 2 of the product holder 1 is not formed. When gas or liquid such as water or the like enters into the side at which the product accommodating portion 2 is not formed, the gas or liquid passes through the through hole 4 and enters into the product accommodating portion 2 side of the product holder 1. At this time, if the semiconductor wafer 10 is accommodated and held in the product accommodating portion 2, and gas or liquid that has entered into the product accommodating 2 side is loaded within the groove portion 3 so as to press against the other end surface 10b of the semiconductor wafer 10. As a result, due to this pressure, the semiconductor wafer 10 which is accommodated and held in the product accommodating portion 2 can be easily removed from the product holder 1. It is not necessary to remove the semiconductor wafer 10 forcibly by using a tool such as a bar member or the like. Further, the semiconductor wafer 10 is not liable to be scratched and is easily handled.

Fourth Embodiment

Figure 5:
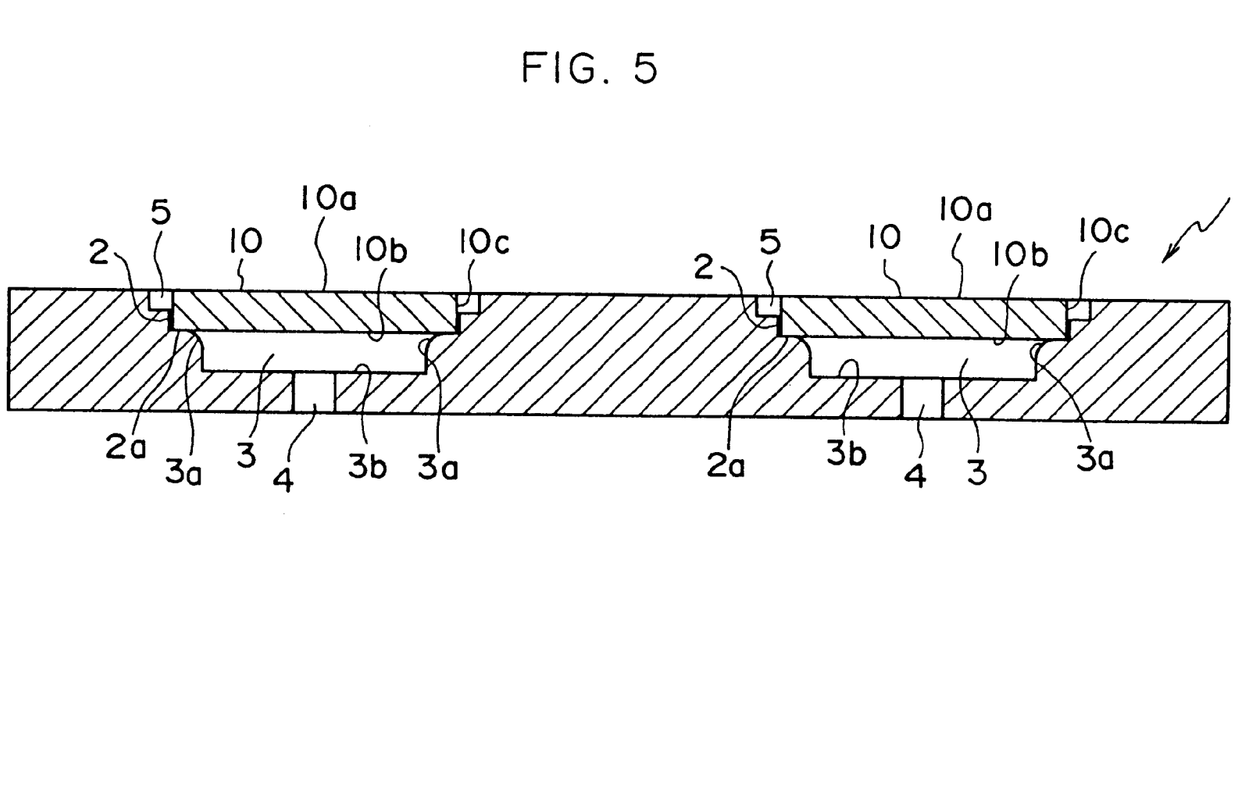
FIG. 5 is a schematic cross-sectional explanatory view for explaining a state in which a semiconductor wafer is accommodated and held in a product holder of a fourth embodiment.

As shown in FIG. 5, a product holder 1 of a fourth embodiment has the same structure as that of the product holder 1 of the third embodiment except for the following difference. The product holder 1 of the fourth embodiment is different from the product holder 1 of the third embodiment in that an outer peripheral groove portion 5 is formed, which exposes a circumferential side surface 10c of the semiconductor wafer 10 accommodated and held in the product accommodating portion 2. On the basis of the difference, in addition to the effects of the product holder 1 of the third embodiment, the product holder 1 of the fourth embodiment has the following effects.

In the product holder 1 of the fourth embodiment, when the semiconductor wafer 10 is accommodated and held in the product accommodating portion 2, a portion of the circumferential side surface 10c of the semiconductor wafer 10 is exposed because of the outer circumferential groove portion 5. Accordingly, when a suitable bar member or the like is made to abut against the circumferential side surface 10c of the semiconductor wafer 10 and is drawn up, the semiconductor wafer 10 can be easily removed from the product accommodating portion 2. At this time, if gas or liquid such as water or the like is made to enter from the through hole 4 as in the third embodiment, the semiconductor wafer 10 can be removed much more easily.

Fifth Embodiment

Figure 6:
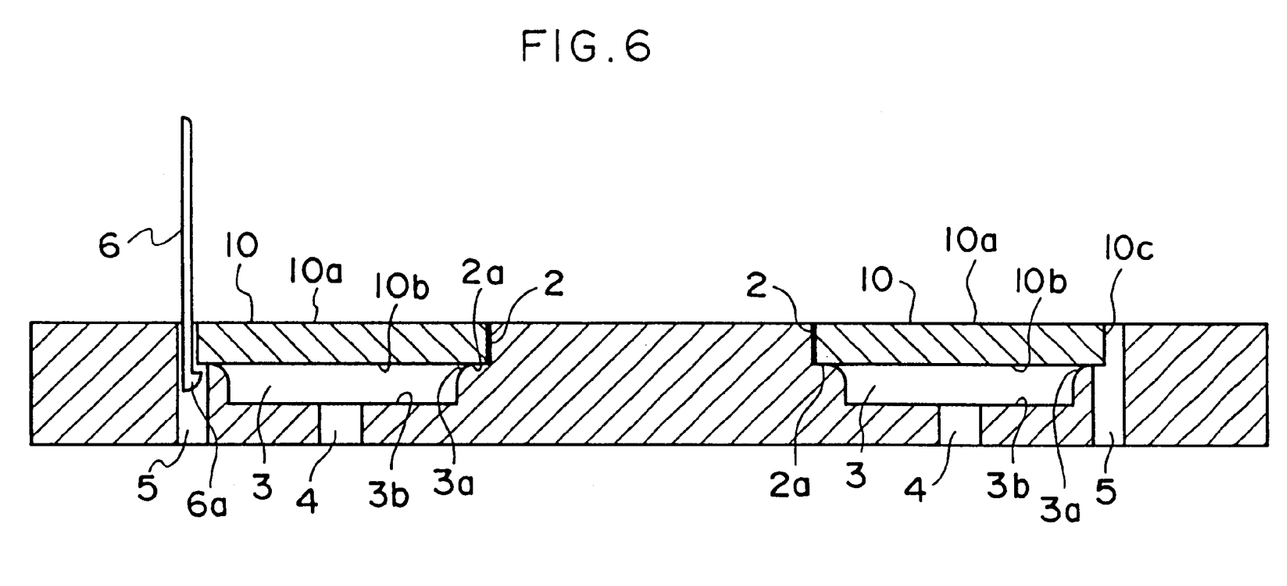
FIG. 6 is a schematic cross-sectional explanatory view for explaining a state in which a semiconductor wafer is accommodated and held in a product holder of a fifth embodiment.
Figure 7:
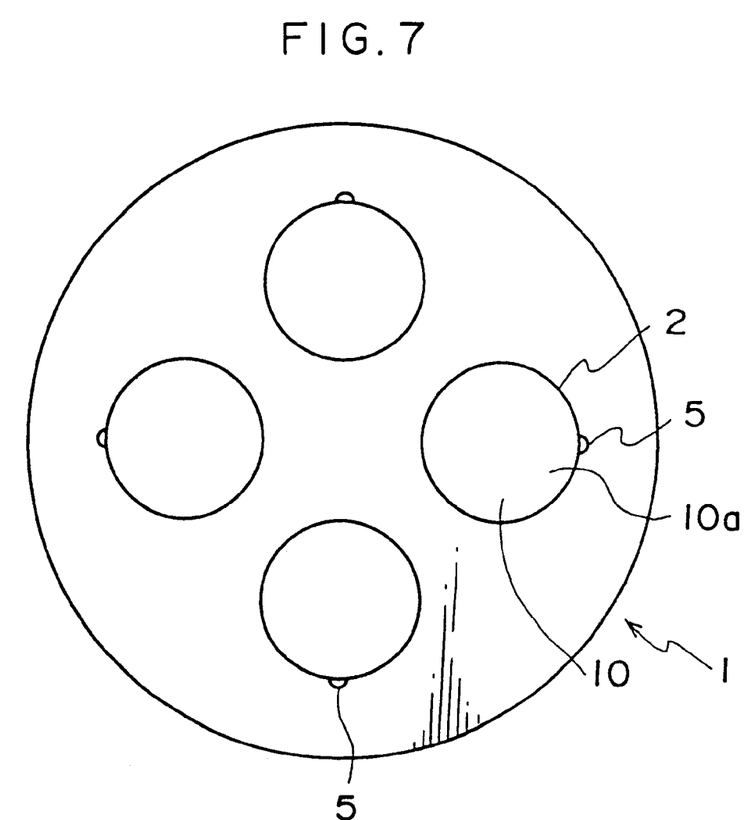
FIG. 7 is a top view for explaining a state in which a semiconductor wafer is accommodated and held in the product holder of a fifth embodiment.

As shown in FIGS. 6 and 7, a product holder 1 of a fifth embodiment has the same structure as that of the product holder 1 of the third embodiment except for the following difference. The product holder 1 of the fifth embodiment is different from the product holder 1 of the third embodiment in that a through hole 5 is formed, by which a portion of the circumferential side surface 10c of the semiconductor wafer 10 accommodated in the product accommodating portion 2 is exposed. A bar member 6 can be inserted therein to remove the semiconductor wafer 10 from the product holder 1, and a portion of an other end surface 10b of the semiconductor wafer 10 is also exposed thereby. On the basis of this difference, in addition to the effects of the product holder 1 of the third embodiment, the product holder 1 of the fifth embodiment has the following effects.

In the product holder 1 of the fifth embodiment, if the semiconductor wafer 10 accommodated and held in the product accommodating portion 2 is to be removed, the bar member 6 is inserted into the through hole 5, a hook portion 6a of the bar member 6 is engaged with the other end surface 10b of the semiconductor wafer 10 and the bar member 6 is drawn up in the engaged position, so as to easily remove the semiconductor wafer 10 from the product accommodating portion 2. At this time, if gas or liquid such as water or the like is made to enter from the through hole 4, the semiconductor wafer 10 is removed much more easily.

In accordance with the present invention, it is possible to provide a product holder that solves conventional problems, does not cause a product to become cracked or contaminated at the time of being conveyed and transported or being subjected to a sputtering treatment or the like, can be detected by an infrared ray sensor, is vastly superior in its strength, durability, chemical resistance and the like, and is easily handled.

What is claimed is:

1. A product holder for holding a product having first and second end surfaces that oppose each other, the product holder comprising a silicon carbide sintered body and including:
   a first surface and a second surface;
   a product accommodating portion which accommodates and holds the product such that the first end surface of the product is exposed and the second end surface of the product is disposed between the first surface and the second surface of the product holder; and
   a groove portion formed in the product accommodating portion at a position that abuts the second end surface of the product, the groove portion including end portions which abut the second end surface when the product is held by the product holder, the end portions being formed with a curved surface.

2. The product holder according to claim 1, wherein the first end surface of the product has a total area, and an area of the second end surface of the product which abuts against the end portions of the groove portion is no more than 50% of the total area of the second end surface.

3. The product holder according to claim 1, wherein the product is a disc-shaped semiconductor wafer.

4. The product holder according to claim 1, wherein the silicon carbide sintered body is formed by sintering a mixture of silicon carbide powder and a non-metallic sintering aid and has a density of at least 2.9 g/cm$^3$.

5. The product holder according to claim 1, wherein the groove portion includes a bottom surface and a through hole is formed through the bottom surface of the groove portion.

6. The product holder according to claim 1, wherein the product includes a circumferential side surface and the product holder includes an outer circumferential groove portion, thereby exposing a circumferential side surface of the product when the product is accommodated in the product accommodating portion.

7. The product holder according to claim 1, wherein the product includes a circumferential side surface, and the product holder includes a through hole, by which a portion of the circumferential side surface of the product accommodated in the product accommodating portion is exposed, into which a bar member is inserted for removing the product, and by which a portion of the second end surface of the product is exposed.

8. The product holder according to claim 1, comprising at least two product accommodating portions.

9. The product holder according to claim 1, wherein the product holder is conductive.

10. The product holder according to claim 1, wherein the product holder consists essentially of a silicon carbide sintered body.

11. The product holder according to claim 1, wherein the product accommodating portion includes a portion having a depth that is equal to about a thickness of the product such that the first end surface of the product is positioned at about the same level as the first surface of the product holder when the product is received in the product accommodating portion.

12. The product holder according to claim 11, wherein the product has a disc shape and a first diameter, and the portion of the product accommodating portion has a disc shape and a second diameter equal to about the first diameter.

13. The product holder according to claim 1, wherein the product accommodating portion includes:
   a portion that extends from the first surface of the product holder to a position between the first surface and the second surface of the product holder; and
   the groove communicates with the portion and the entire groove is spaced from the second surface.

14. The product holder according to claim 13, wherein:
   the portion is disc shaped and has a first diameter; and
   the groove is concentric with the portion, and the groove is disc shaped and has a second diameter smaller than the first diameter.

15. The product holder according to claim 1, wherein the first surface of the product holder is flat and the product accommodating portion includes a portion having a depth that is equal to about a thickness of the product such that the first end surface of the product is positioned at about the same level as the first surface of the product holder and the second end surface of the product is disposed between the first surface and the second surface of the product holder when the product is received in the product accommodating portion.

16. The product holder according to claim 15, wherein the product holder consists essentially of a silicon carbide sintered body.

17. A method of holding a product having first and second end surfaces that oppose each other, comprising:
   providing the product holder according to claim 1; and
   placing the product in the product accommodating portion of the product holder such that the first end surface of the product is exposed and the second end surface of the product is disposed between the first surface and the second surface of the product holder.

18. A product holder for holding a product having first and second end surfaces that oppose each other and a circumferential side surface, the product holder comprising a silicon carbide sintered body and including:

a product accommodating portion which accommodates and holds the product such that the first end surface of the product is exposed;

a groove portion formed in the product accommodating portion at a position that abuts the second end surface of the product; and a through hole by which a portion of the circumferential side surface of the product accommodated in the product accommodating portion is exposed, into which a bar member is inserted for removing the product, and by which a portion of the second end surface of the product is exposed.

* * * * *